(12) United States Patent
Sasaki (10) Patent No.: US 8,502,571 B2
(45) Date of Patent: Aug. 6, 2013

(54) GATE DRIVING CIRCUIT

(75) Inventor: Kazuki Sasaki, Saitama-Ken (JP)

(73) Assignee: Sanken Electric Co., Ltd., Saitama-Ken (JP)

( * ) Notice: Subject to any disclaimer, the term of this patent is extended or adjusted under 35 U.S.C. 154(b) by 0 days.

(21) Appl. No.: 13/480,758

(22) Filed: May 25, 2012

(65) Prior Publication Data

US 2012/0299625 A1    Nov. 29, 2012

(30) Foreign Application Priority Data

May 26, 2011    (JP) .................................. 2011-117759

(51) Int. Cl.
*H03K 3/00* (2006.01)
(52) U.S. Cl.
USPC .............. 327/108; 327/110; 363/98; 363/132
(58) Field of Classification Search
USPC ............................. 327/108, 110; 363/98, 132
See application file for complete search history.

(56) References Cited

U.S. PATENT DOCUMENTS

| 4,629,993 | A  | * | 12/1986 | Bouvier et al.  | 327/126 |
| 6,917,225 | B2 | * | 7/2005  | Lopez et al.    | 327/108 |
| 7,701,733 | B2 | * | 4/2010  | Yang et al.     | 363/21.06 |
| 7,880,440 | B2 | * | 2/2011  | Takahashi et al. | 320/139 |

FOREIGN PATENT DOCUMENTS

JP    7-226664    8/1995

* cited by examiner

*Primary Examiner* — Kenneth B. Wells
(74) *Attorney, Agent, or Firm* — Wilmer Cutler Pickering Hale and Dorr LLP (57) ABSTRACT

A gate driving circuit includes a control power; a transformer having a primary winding and a secondary winding; a first switching element; a second switching element; a rectifying element; and a capacitance element, wherein the first switching element is connected between the control power and one end of the primary winding, and the second switching element is connected to the other end of the primary winding, wherein one end of the capacitance element is connected to either one of the one end and the other end of the primary winding, and wherein, when one of the first switching element and the second switching element is turned on, the capacitance element is charged by the control power, and when the other of the first switching element and the second switching element is turned on, the capacitance element is discharged.

10 Claims, 8 Drawing Sheets

FIG. 1
BACK GROUND ART

FIG. 2  BACK GROUND ART

FIG. 3  BACK GROUND ART

GATE DRIVING CIRCUIT

CROSS-REFERENCE TO RELATED APPLICATION

This application claims priority from Japanese Patent Application No. 2011-117759 filed on May 26, 2011, the entire subject matter of which is incorporated herein by reference.

TECHNICAL FIELD

This disclosure relates to a gate driving circuit using a semiconductor switching element, and more specifically to a gate driving circuit which can reduce power consumption.

BACKGROUND

Figure 1:
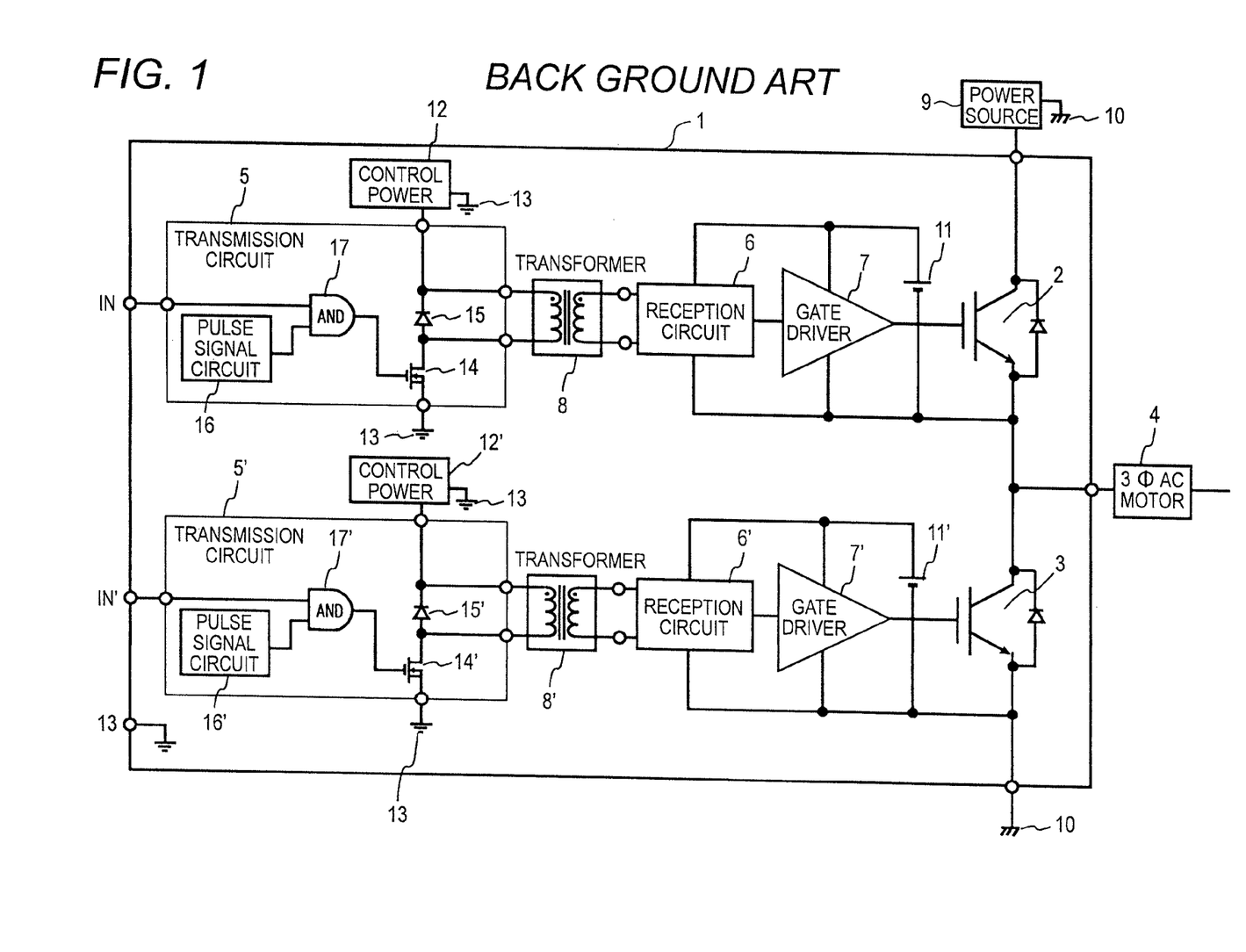
FIG. 1 is a diagram illustrating the configuration of a gate driving circuit of a semiconductor switching element in the background art.

There has been used an electronic device, which controls voltage and current that are supplied to a load by turning on/off a semiconductor switching element. FIG. 1 illustrates an electronic device in the background art that is configured to drive a three-phase AC motor by some modifications of a driving circuit, as disclosed in JP-A-H07-226664.

The configuration of the electronic device illustrated in FIG. 1 will be briefly described. Although this electronic device is connected to a three-phase AC motor as a load 4, FIG. 1 illustrates only one of three phases. That is, in the case of driving the three-phase AC motor, the electronic device illustrated in FIG. 1 is used for each of three phases (the device typically called an inverter device or the like). In a unit 1 for one phase, a semiconductor switching element 2 (IGBT (Insulated Gate Bipolar Transistor) with a free-wheeling diode) of an upper arm and a semiconductor switching element 3 (IGBT with a free-wheeling diode) of a lower arm are connected in series between a power 9 for driving the load and a grounding point 10, and the connection point thereof is connected to one end of the load 4. The load 4 is configured to form a Y-connection or a delta-connection together with loads 4 connected to units of other two phases. Gate driving circuits having the same configuration are provided in the semiconductor switching element 2 of the upper arm and the semiconductor switching element 3 of the lower arm, respectively. Each of the gate driving circuits includes a transmission circuit 5 (5'), a reception circuit 6 (6'), and a gate driver 7 (7'), and a signal of the transmission circuit 5 (5') is transmitted to the reception circuit 6 (6') through a transformer 8 (8'). A control power 11 (11') is connected to the reception circuit 6 (6') and the gate driver 7 (7').

The transmission circuit 5 (5') is connected between a control power 12 (12') and a grounding point 13 (that is isolated from the grounding point 10), and the transformer 8 (8') and an NMOS transistor 14 (14') are connected in series between the control power 12 (12') and a grounding point 13. The gate terminal of the NMOS transistor 14 (14') is connected to the output terminal of an AND circuit 17 (17'), and the input terminal of the AND circuit 17 (17') is connected to an IN signal (IN' signal) input terminal (control input signal terminal) and the output terminal of a pulse signal circuit 16 (16').

Accordingly, when the IN (IN') signal (control input signal) is in an active state, the pulse signal from the pulse signal circuit 16 (16') is input to the gate terminal of the NMOS transistor 14 (14') through the AND circuit 17 (17'). If the pulse signal from the pulse signal circuit 16 (16') is input to the gate terminal of the NMOS transistor 14 (14'), the NMOS transistor 14 (14') is driven to be turned on/off, and a voltage that is caused by the pulse signal is applied to the primary winding of the transformer 8 (8'). On the other hand, a diode (rectifying element) 15 (15') is connected to suppress the occurrence of overvoltage by flowing a reverse voltage that is generated in the primary winding of the transformer 8 (8') as a circulating current. Since a voltage induced in the secondary winding of the transformer 8 (8') is proportional to the primary winding, the reception circuit 6 (6') generates a gate driving signal in response to this voltage as a trigger signal. The gate driving signal from the reception circuit 6 (6') is amplified by the gate driver 7 (7'), and the semiconductor switching element 2 (3) is driven to be turned on/off by the amplified gate driving signal.

Figure 2:
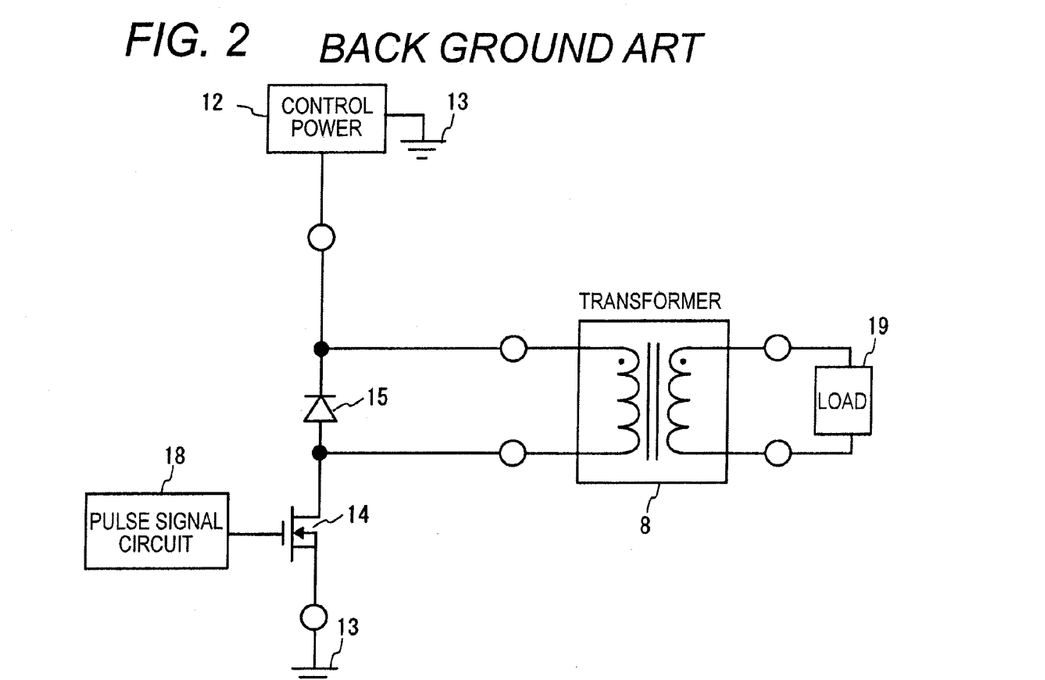
FIG. 2 is a diagram illustrating the configuration of one main portion in the gate driving circuit of FIG. 1 in the background art.

FIG. 2 illustrates a gate driving circuit using the semiconductor switching element 2 (3) of FIG. 1 that transmits the signal of the transmission circuit 5 (5') to the reception circuit 6 (6') through the transformer 8 (8'). Here, since the gate driving circuits using the semiconductor switching element 2 of the upper arm and the semiconductor switching element 3 of the lower arm have the same configuration, for example, only the upper arm that is extracted from FIG. 1 is illustrated in FIG. 2. Further, in FIG. 2, the IN signal input terminal IN, the pulse signal circuit 16, and the AND circuit 17 are integrally described as a pulse signal circuit 18. Further, the reception circuit 6, the gate driver 7, the semiconductor switching element 2, the load 4, the power 9 for driving the load, the control power 11, and the grounding point 10 are integrally described as a load 19. FIG. 2 as described above illustrates one of main portions the background art related to this disclosure.

Figure 3:
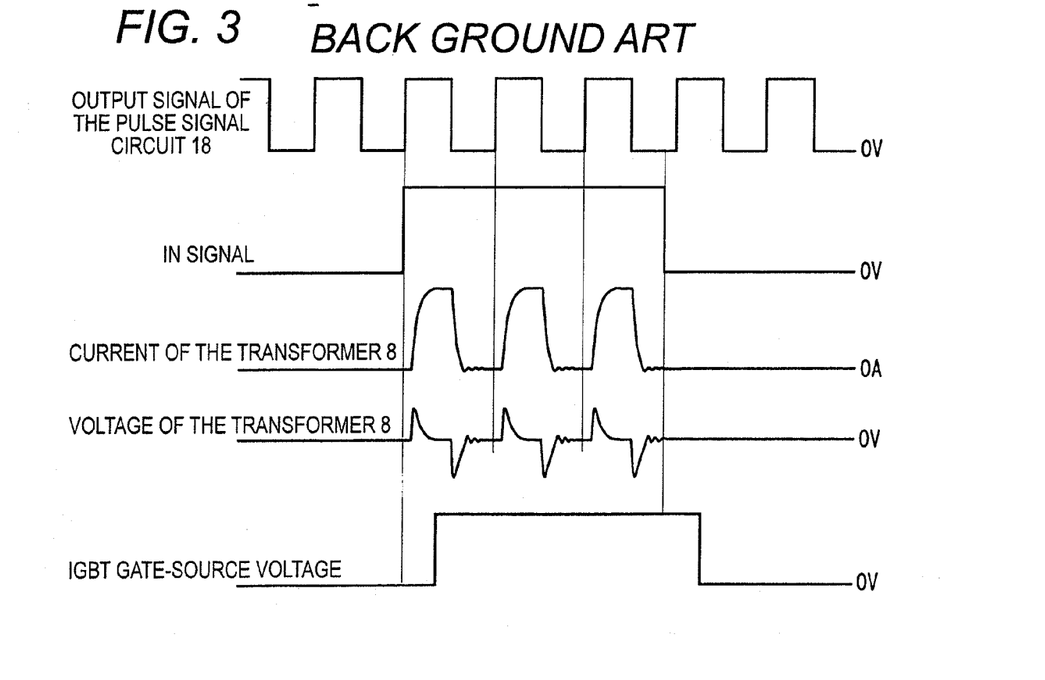
FIG. 3 is an operational waveform diagram illustrating the operation of a gate driving circuit in the background art.

FIG. 3 is a waveform diagram illustrating the operation of a circuit illustrated in FIG. 2. The pulse signal circuit 18 outputs a continuous square-wave pulse as shown as the "output signal of the pulse signal circuit 18" in FIG. 3. If the "IN signal" is at a high level, as can be seen from FIG. 1, the AND circuit 17 passes the pulse signal from the pulse signal circuit 16 to drive the NMOS transistor. As shown in FIG. 3, when the "IN signal" is at a high level and the "pulse signal" is at a high level, the NMOS transistor 14 is turned on to apply a voltage to the transformer 8, and thus current flow through the transformer 8. In this case, a positive voltage is generated in the "voltage of the transformer 8" corresponding to the rising of the "current of the transformer 8", and a negative voltage is generated in the "voltage of the transformer 8" corresponding to the falling of the "current of the transformer 8". The reception circuit 6 and the gate driver 7 on the secondary side of the transformer are driven by the signal only when the "voltage of the transformer 8" is positive, and then supply the gate driving signal for turning on the semiconductor switching element 2, as shown in the "IGBT gate-source voltage" at the bottom of FIG. 3

SUMMARY

According to the gate driving circuit in the background art, when the NMOS transistor 14 is switched from an open state to a conducting state, the positive voltage that is generated in the transformer 8 is transmitted as a trigger signal of the reception circuit to turn on the semiconductor switching element 2. In this case, while the output of the pulse signal circuit 16 is at a high level, the NMOS transistor 14 is in a conducting state, and current flows continuously through the transformer 8 and the NMOS transistor 14. However, since the trigger signal is transferred to the reception circuit 6 by the transformer 8 for a short time from the moment only when the NMOS transistor 14 is switched from the open state to the conducting state, useless current flows while the output of the pulse signal circuit is kept at a high level. As described above, in the gate driving circuit in the background art, the useless current flows to cause unnecessary power consumption.

Accordingly, this disclosure has been made in consideration of the above-described situations, and this disclosure provides at least a gate driving circuit that can reduce power consumption by suppression of the useless current from flowing.

In view of the above, a gate driving circuit of this disclosure comprises a control power; a transformer having a primary winding and a secondary winding; a first switching element; a second switching element; a rectifying element; and a capacitance element, wherein the first switching element is connected between the control power and one end of the primary winding, and the second switching element is connected to the other end of the primary winding, wherein both ends of the rectifying element are connected in parallel to both ends of the primary winding, wherein one end of the capacitance element is connected to either one of the one end and the other end of the primary winding, and wherein, when one of the first switching element and the second switching element is turned on, the capacitance element is charged by the control power, and when the other of the first switching element and the second switching element is turned on, the capacitance element is discharged.

The above-described gate driving circuit may further comprises a reception circuit, which detects a wiring voltage generated in the secondary winding in accordance with rising and falling of current flowing into the primary winding, and the reception circuit may outputs a control pulse signal according to the wiring voltage.

In the above-described gate driving circuit, one end of the capacitance element may be connected to one end of the primary winding.

In the above-described gate driving circuit, one end of the capacitance element may be connected to the other end of the primary winding.

In the above-described gate driving circuit, the other end of the capacitance element may be grounded.

In the above-described gate driving circuit, the other end of the capacitance element may be connected to the control power.

In the above-described gate driving circuit, the capacitance element may be configured to be charged with passing the primary winding when the capacitance element is charged by the control power and to be discharged without passing the primary winding when the capacitance element is discharged.

In the above-described gate driving circuit, the capacitance element may be configured to be charged without passing the primary winding when the capacitance element is charged by the control power and to be discharged with passing the primary winding when the capacitance element is discharged.

In the above-described gate driving circuit, the capacitance element may be configured to be discharged with passing the primary winding when the capacitance element is discharged.

In the above-described gate driving circuit, the capacitance element may be configured to be charged with passing the primary winding when the capacitance element is charged by the control power.

According to the above, this disclosure suppresses useless current from flowing through the gate driving circuit using the semiconductor switching element, and thus the efficiency is improved.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Hereinafter, preferred embodiments of this disclosure will be described in detail with reference to the accompanying drawings. First, one embodiment of this disclosure will be described referring to FIGS. 4 to 7, and then other embodiments of this disclosure will be described referring to FIGS. 8 to 11.

Embodiment 1

Figure 4:
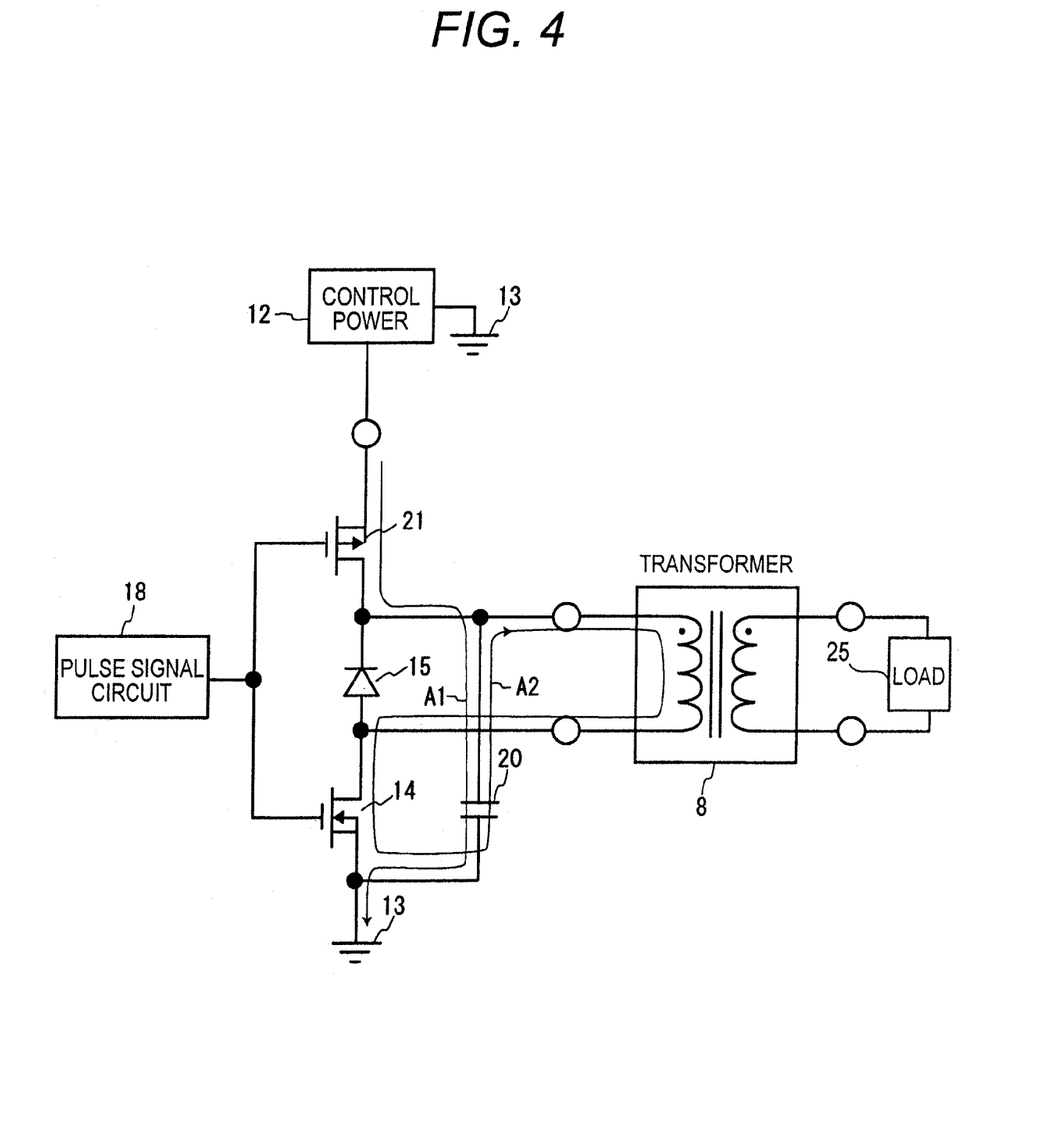
FIG. 4 is a diagram illustrating the circuit configuration of a gate driving circuit according to embodiment 1 of this disclosure.
Figure 5:
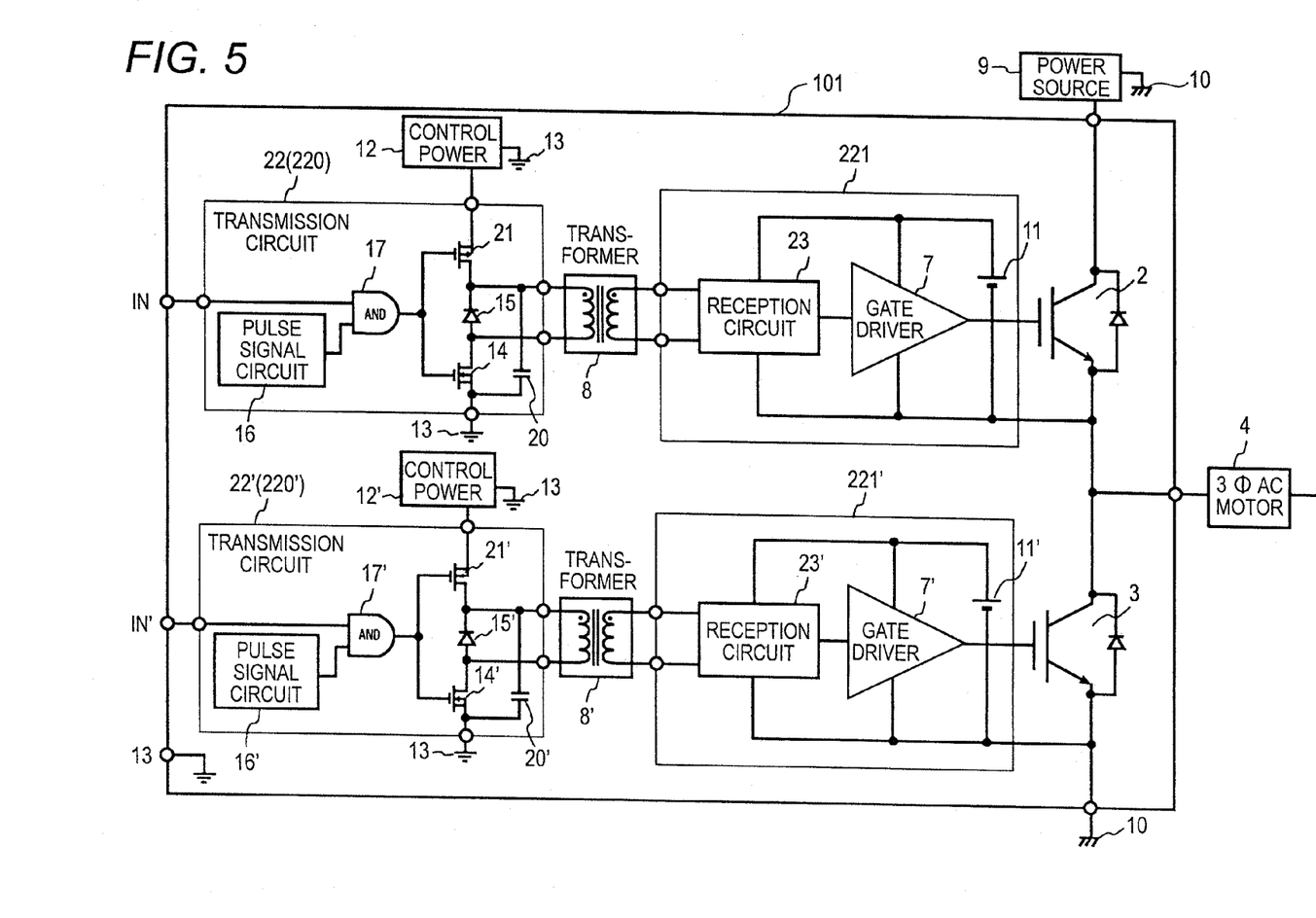
FIG. 5 is a diagram illustrating the configuration of an application circuit in which the gate driving circuit according to embodiment 1 of this disclosure is applied to an inverter device.

FIG. 4 is a diagram illustrating, a gate driving circuit according to one embodiment of this disclosure, in which the background art technology as shown in FIG. 2 is improved. The circuit configuration illustrated in FIG. 4, for example, illustrates a gate driving circuit that corresponds to a semiconductor switching element 2 (IGBT having a free-wheeling diode) of an upper arm, and specifically includes a transmission circuit 22, a transformer 8, a reception circuit 23, a gate driver 7, a semiconductor switching element 2, and a load 4, as shown in FIG. 5. FIG. 4 is a diagram illustrating the circuit configuration of a gate driving circuit of a semiconductor switching element 2 shown in FIG. 5 in the same simplified manner as FIG. 2. In FIG. 4, the same reference numerals as those in FIG. 2 denote the same function units or members. In comparison to the background circuit configuration of FIG. 2, the gate driving circuit according to embodiment 1 is further includes a capacitor (capacitance element) 20 and a PMOS transistor 21, and a load 25 corresponds to the load 19. The load 25, as described later with reference to FIG. 6, has the circuit configuration, in which the configuration of the reception circuit 23 is digitalized using a logic circuit to be easily integrated into an Integrated Circuit (IC).

The circuit configuration will be described with reference to FIG. 4. A PMOS transistor 21, the primary winding of a transformer 8, and an NMOS transistor 14 are sequentially connected in series between a control power 12 and a grounding point 13, and a diode 15 is connected at both ends of the primary winding of the transformer 8 so that the NMOS transistor 14 and the PMOS transistor 21 are connected in a forward direction. Further, a load 25 is connected at both ends of the secondary winding of the transformer 8. The gates of the NMOS transistor 14 and the PMOS transistor 21 are connected to the output terminal of a pulse signal circuit 18, and the NMOS transistor 14 and the PMOS transistor 21 are driven by a pulse signal of the pulse signal circuit 18. Further, one end of a capacitor 20 is connected to a connection point at which the drain terminal of the PMOS transistor 21, one end of the primary winding of the transformer 8, and the cathode terminal of the diode 15 are connected with each other, and the other end of the capacitor 20 is connected to a grounding point 13.

FIG. 5 illustrates only one phase (unit 101) of an electronic device to which a three-phase AC motor is connected. In the unit 101, a semiconductor switching element 2 (semiconductor switching element of an upper arm) and a semiconductor switching element 3 (semiconductor switching element of a lower arm) are connected in series between a power 9 and a grounding point 10, and the connection point thereof is connected to a load 4 as an output terminal of the unit 101. In each of the semiconductor switching elements 2 and 3, an IGBT having a free-wheeling diode is used, and the gate driving circuit illustrated in FIG. 4 is applied to each of gate driving circuits using the semiconductor switching element 2 and the semiconductor switching element 3. In the case where the load 4 is the three-phase AC motor, the electronic device is configured as an inverter device that outputs a three-phase AC using three sets of the units 101.

FIG. 5 illustrates the detailed configuration of the pulse signal circuit illustrated in FIG. 4, in which a pulse signal circuit 16 and an AND circuit 17 are combined. That is, one input terminal of the two-input AND circuit 17 is connected to an IN signal input terminal, and the other input terminal thereof is connected to the output terminal of the pulse signal circuit 16. Further, gate terminals of the NMOS transistor 14 and the PMOS transistor 21 are commonly connected to the output terminal of the AND circuit 17. The transmission circuit 22, which includes the NMOS transistor 14, the PMOS transistor 21, the diode 15, the capacitor 20, the pulse signal circuit 16, and the AND circuit 17, is integrated into a module (integrated circuit (IC)) 220, and thus the mounting area and volume occupied can be reduced. The module (integrated circuit (IC)) 220 is connected between the control power 12 and the grounding point 13, and the output thereof is connected to the primary winding of the transformer 8.

Figure 6:
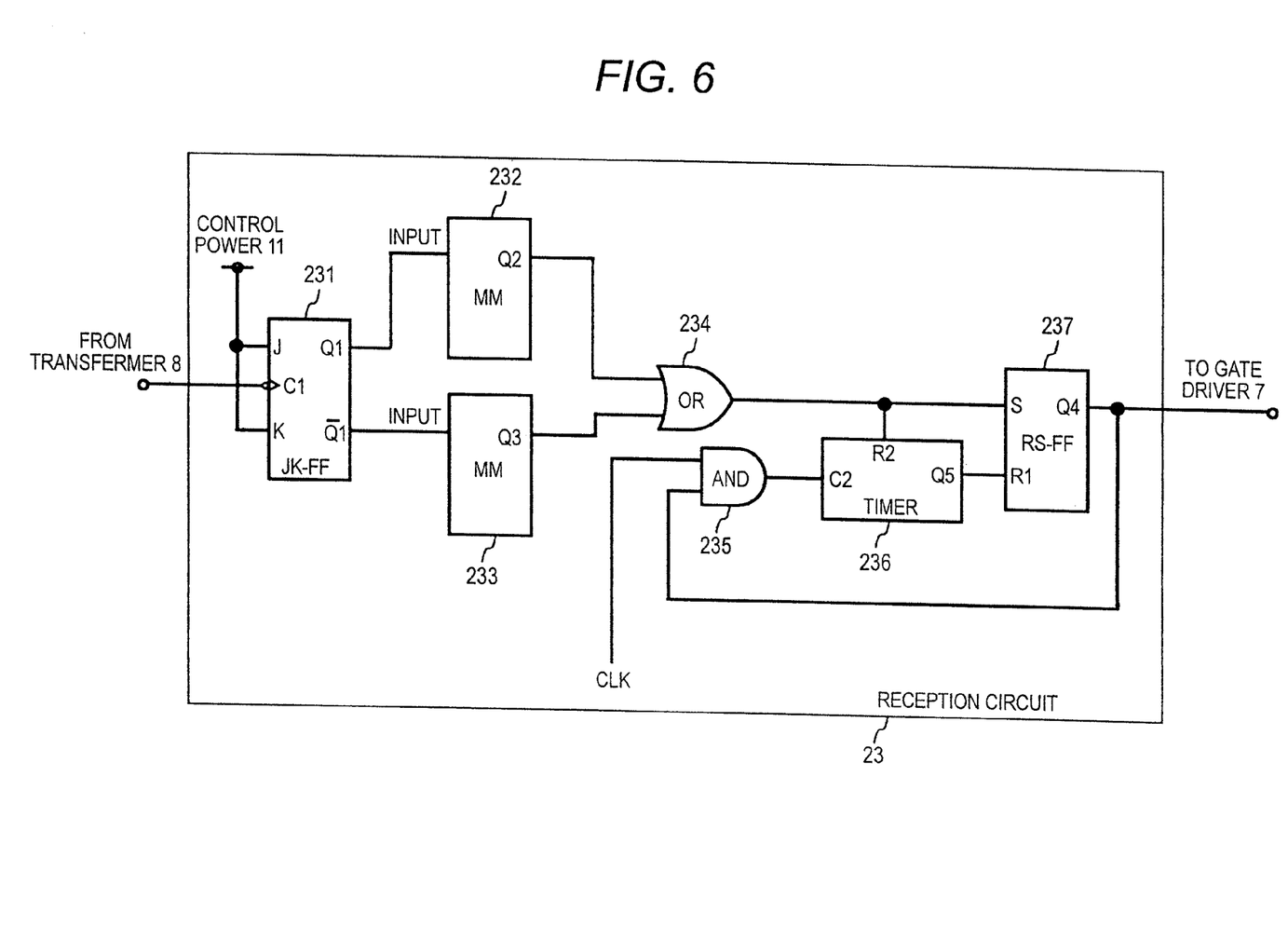
FIG. 6 is a diagram illustrating a one example of the configuration of a reception circuit in a gate driving circuit according to this disclosure.

Further, FIG. 5 illustrates the detailed configuration of the load 25 illustrated in FIG. 4, in which the reception circuit 23, the gate driver 7, the control power 11, the semiconductor switching element 2, the power 9, and the load 4 are combined. That is, both ends of the secondary winding of the transformer 8 are connected to the input terminal of the reception circuit 23, and the output terminal of the reception circuit 23 is connected to the input terminal of the gate driver 7. Further, the output terminal of the gate driver 7 is connected to the gate terminal of the semiconductor switching element 2. Further, the control power 11 is connected to the reception circuit 23 and the gate driver 7. The reception circuit 23, as shown in FIG. 6, is configured to be digitalized using a logic circuit, and thus has the circuit configuration that can be easily integrated. The reception circuit 23, the gate driver 7, and the control power 11 are integrated into one module (integrated circuit (IC)) 221, and thus the mounting area and volume occupied can be small-sized.

Similarly to the semiconductor switching element 2, the gate side of the semiconductor switching element 3 has a gate driving circuit that includes a transmission circuit 22' (which is included a module (IC) 220'), a reception circuit 23', a gate driver 7', and a control power 11'(which is included in a module (IC) 221'). The circuits of the semiconductor switching elements 2 and 3 of the upper and lower arms having these gate driving circuits constitute a unit 101. Further, by using three sets of the units 101 as the inverter circuit that outputs the three-phase AC, the three-phase AC motor as the load 4 is driven. The unit 101 may has a user-friendly configuration according to modularization into an exchangeable unit. On the other hand, the unit 101 is not limited to the driving of the three-phase AC motor and can drive a general three-phase load. In addition, a single-phase AC can be output using two sets of the units 101, and it is also possible to assemble the units 101 as a variable DC output device or an AC output device having four phases or more.

FIG. 6 illustrates a concrete example of the reception circuit 23. The reception circuit 23 has the circuit configuration, which is digitalized using a logic circuit to be easily integrated into the IC. As shown in FIG. 6, the reception circuit 23 includes a JK flip-flop (JK-FF) 231, a monostable multivibrator (MM) 232, 233, an OR gate 234, an AND gate 235, a timer circuit 236, and an RS flip-flop (RS-FF) 237.

First, the configuration of the reception circuit 23 will be described. The clock input terminal C1 of the JK-FF 231 is connected to the secondary winding of the transformer 8. Further, the output terminal Q1 of the JK-FF 231 is connected to the input terminal of the monostable multivibrator 232, and the output terminal −Q1 that inverts the logic of the output terminal Q1 is connected to the input terminal of the monostable multivibrator 232. The output terminal Q2 of the monostable multivibrator 232 and the output terminal Q3 of the monostable multivibrator 233 are connected to one or the other input terminal of the OR circuit 234, respectively, and the output terminal of the OR circuit 234 is connected to the set input terminal S of the RS-FF 237. Further, the timer circuit 236 has an output terminal Q5 connected to the reset terminal R1 of the RS-FF 237, a reset terminal R2 connected to the output terminal of the OR circuit 234, and a clock input terminal C2 connected to the output terminal of the AND circuit 235. A clock signal CLK for a timer counter is input to one input terminal of the AND circuit 235, and the output terminal Q4 of the RS-FF 237 is connected to the other input terminal. Further, the output terminal Q4 of the RS-FF 237 is connected to the gate driver 7.

Then, the operation of the reception circuit 23 will be described based on waveforms in FIG. 7.

As the NMOS transistor 14 and the PMOS transistor 21 are controlled to be turned on/off, the transformer 8 generates a secondary winding voltage that is proportional to the primary winding voltage (refer to waveforms of "voltage of the transformer 8"). Whenever the voltage generated in the secondary winding of the transformer 8 is input to the clock input terminal C1 of the JK-FF 231 as shown in FIG. 6, the "signal of the output terminal Q1 of the JK-FF 231" is inverted as shown in FIG. 7.

If the "output signal Q1 of the JK-FF 231" is input to the monostable multivibrator 232 as shown in FIG. 6, the monostable multivibrator 232 outputs a pulse signal that becomes high level only for a predetermined period from the rising edge of the input signal. Further, if the signal of the output terminal −Q that is obtained by inverting the logic of the output terminal Q of the JK-FF 231 is input to the monostable multivibrator 233 as shown in FIG. 6, the monostable multivibrator 233 outputs a pulse signal that becomes high level only for a predetermined period from the rising edge of the input signal.

The signals from the output terminal Q2 of the monostable multivibrator 232 and the output terminal Q3 of the monostable multivibrator 233 are logically summed by the OR circuit 234. In a period where the IN signal becomes high level, a pulse signal that is synchronous with the rising edge of the square-wave pulse signal of the pulse signal circuit 18 is output.

Further, the output of the OR circuit 234 is input to the set input terminal S of the RS-FF 237. If the pulse signal from the OR circuit 234 is input to the set input terminal S of the RS-FF 237, a high-level signal is output from the output terminal Q4 of the RS-FF 237. On the other hand, the output of the timer circuit 236 is input to the reset terminal R1 of the RS-FF 237, and if the timer circuit 236 counts up and the pulse signal from the output terminal Q5 is input to the reset terminal R1, the output terminal Q4 of the RS-FF 237 is reset to a low level.

The timer circuit 236 receives an input of the clock signal CLK for the timer counter through the AND circuit 235 in a period where the signal of the output terminal Q4 of the RS-FF 237 becomes high level. However, since the interval of the pulse signal input from the OR circuit 234 to the reset terminal R2 of the timer circuit 236 is set to be shorter than a count-up time of the timer circuit 236, the timer circuit 236 is reset by the pulse signal from the OR circuit 234, and thus does not count up (time t1, t2, and t3). Accordingly, as long as the pulse signal is output from the OR circuit 234, the output of the RS-FF 237 is not reset, but keeps a high level. However, if there is no pulse signal from the OR circuit 234, the timer circuit 236 is not reset to keep counting, and when the count-up time reaches time t4, the timer circuit 236 performs count-up to output a pulse signal having a predetermined width through the output terminal Q5.

Figure 7:
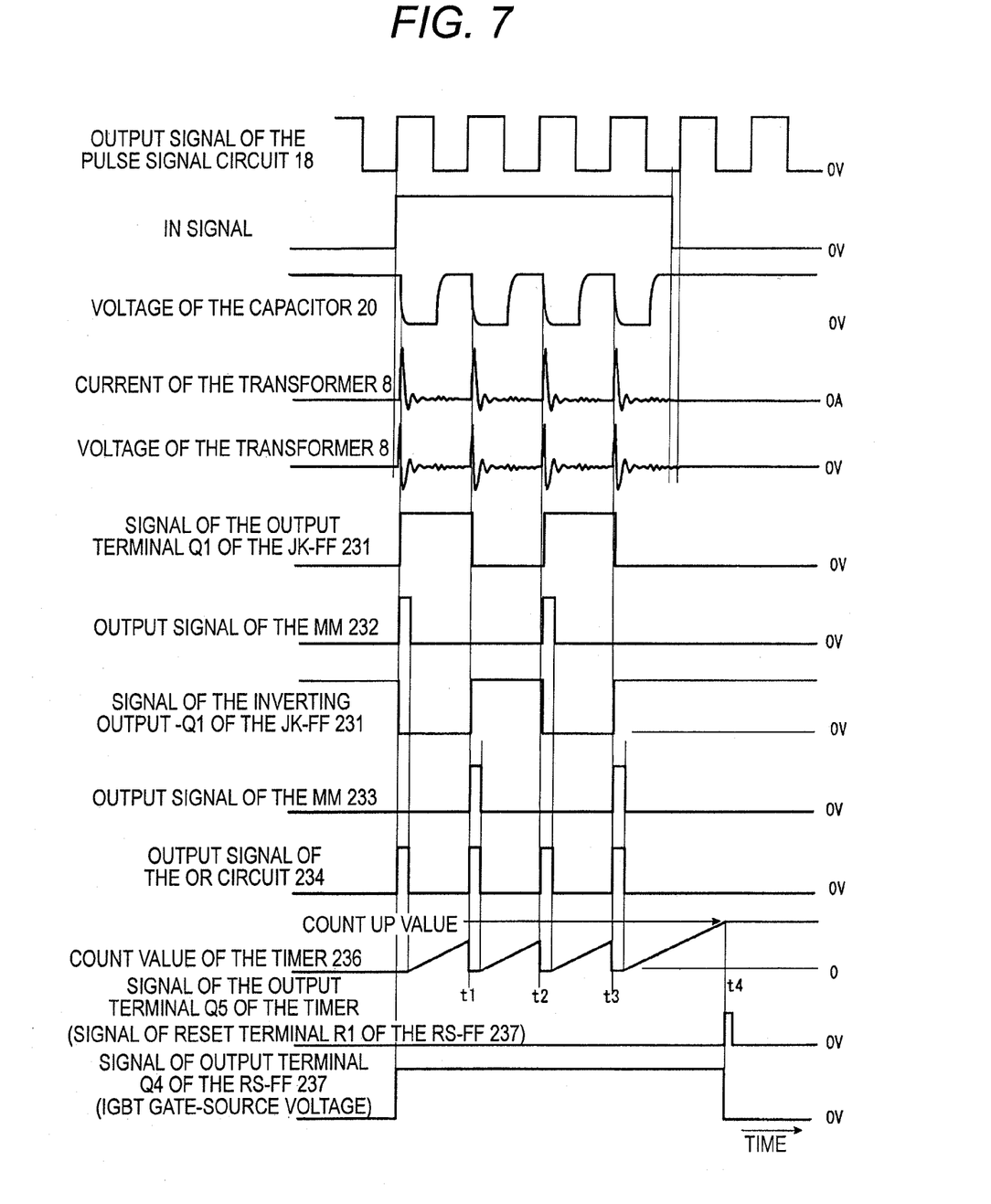
FIG. 7 is an operational diagram of a gate driving circuit according to this disclosure.

The RS-FF 237 is reset by the pulse signal when the timer circuit 236 has counted up to output the signal, as shown at the lowermost portion of FIG. 7. The output signal of the RS-FF 237 is output to the gate driver 7 as an "IGBT gate-source voltage" for driving the semiconductor switching element 2.

Referring to the operational waveform diagram of FIG. 7, the operation of the gate driving circuit of FIG. 4 or 5 will be described.

The pulse signal circuit 18 outputs a continuous square-wave pulse signal as shown in FIG. 7. The IN signal rises to a high level at a predetermined timing to correspond to a period in which the gate signal is supplied to the gate terminal of the semiconductor switching element 2, and then falls to a low level at a predetermined timing. Although FIG. 7 illustrates that the high-level IN signal includes four square-wave pulses of the pulse signal circuit 18, this is merely example and the IN signal may be kept at a high level as long as the desired length. If the square-wave pulse signal of the pulse signal circuit 18 is at a high level and the IN signal is also at a high level, the NMOS transistor 14 is turned on (at this time, the PMOS transistor 21 is turned off). And, if one of the square-wave pulse signal of the pulse signal circuit 18 and the IN signal is at a low level, the PMOS transistor is driven to be turned on (at this time, the NMOS transistor 14 is turned off).

Accordingly, in a low-level period of the IN signal before the IN signal becomes high level, the PMOS transistor 21 is turned on to connect the capacitor 20 between the control power 12 and the grounding point 13, and then the capacitor is charged almost up to the voltage of the control power 12 (a charging path of the capacitor 20 becomes a path A1 as shown in FIG. 4). If the IN signal becomes high level and the output of the AND circuit 17, through which the square-wave pulse signal of the pulse signal circuit 18 has passed, becomes high level, the NMOS transistor 14 is turned on and the voltage of the capacitor 20 is discharged almost to 0V by flowing the primary winding of the transformer 8 (a discharge path of the capacitor 20 becomes a path A2 as shown in FIG. 4) due to the rising of the square-wave pulse signal. Further, if the output of the AND circuit 17 becomes low level, the NMOS transistor 14 is turned off, the PMOS transistor 21 is turned on, and the capacitor 20 is charged almost up to the voltage of the control power 12 (the charging path of the capacitor 20 is the path A1 as shown in FIG. 4). In a period where the IN signal is at a high level, the capacitor 20 repeats charging and discharging in accordance with the square-wave pulse signal of the pulse signal circuit 18.

As described above, in the period where the IN signal is at a high level, the voltage charged in the capacitor 20 when the PMOS transistor 21 is turned on is applied to the primary winding of the transformer 8 at a moment when the NMOS transistor 14 is turned on. Since the voltage is applied to the transformer for only a short time, in which the charge of the capacitor 20 is discharged, from the moment when the NMOS transistor 14 is turned on, no voltage is applied to the transformer 8 in the period when the continuous square-wave pulse signal of the pulse signal circuit 18 is at a high level, and thus useless current does not flow. The "current of the transformer 8" and the "voltage of the transformer 8" in FIG. 7 show the operational waveforms at that time.

Since a voltage induced, in the secondary winding of the transformer 8 is proportional to the primary winding, the reception circuit 23 receives the voltage as a trigger signal and outputs an "IGBT gate-source voltage" signal that is the gate driving signal shown at the lowermost portion of FIG. 7. The gate driving signal from the reception circuit 23 is amplified by the gate driver 7 to turn on/off the semiconductor switching element 2.

As described above, according to this embodiment, the current flows into the transformer 8 for only a short time from the moment when the pulse signal of the pulse signal circuit 18 rises to a high level as shown in FIG. 7, but no current flows in the period when the pulse signal of the pulse signal circuit 18 is kept at the high level. According to this embodiment, in which the charge of the capacitor 20 is discharged from the moment when the NMOS transistor 14 is turned on, no voltage is applied to the transformer 8 in the period when the continuous square-wave pulse signal of the pulse signal circuit 18 is at a high level, and thus the useless current does not flow to the gate driving circuit to improve the efficiency.

Further, since the reception circuit is configured by a logic circuit, it is to be modularized and easily integrated to achieve to the miniaturization of the gate driving circuit.

Embodiment 2

Figure 8:
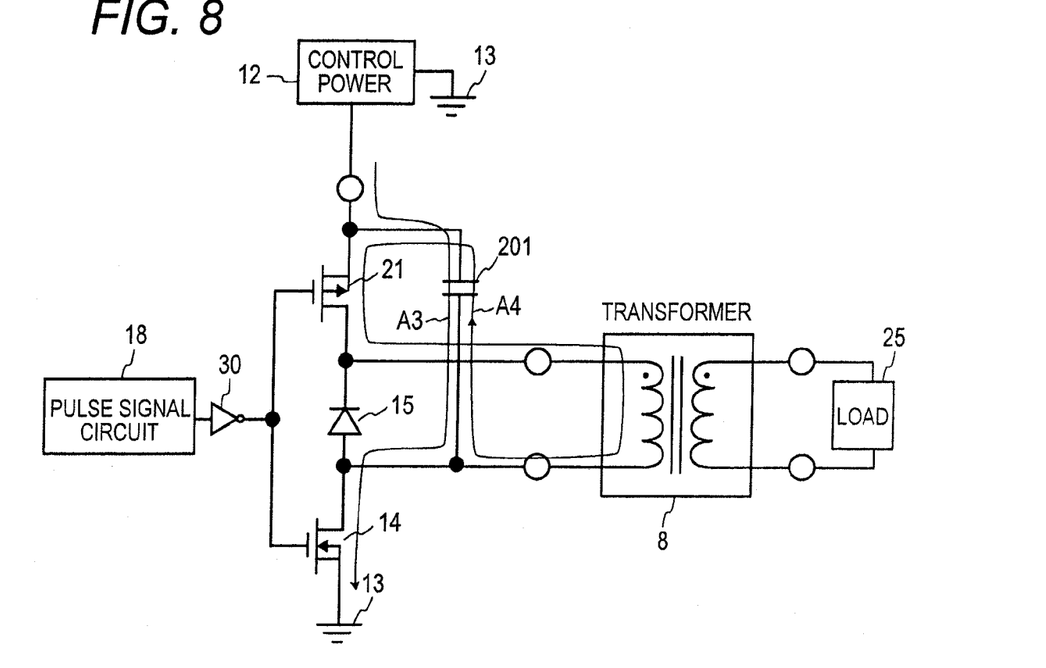
FIG. 8 is a diagram illustrating the circuit configuration of a gate driving circuit according to embodiment 2 of this disclosure.

FIG. 8 illustrates embodiment 2 of this disclosure. Embodiment 2 is different from embodiment 1 in points that the connection portion of the capacitor 20 is modified (shown as a capacitor 201) and an inverter circuit 30 is added to the output side of the pulse signal circuit 18. That is, one end of the capacitor 201 is connected to a connection point where the drain terminal of the NMOS transistor 14, the other end of the transformer 8, and the anode terminal of the diode 15 are connected with each other. The other end of the capacitor 201 is connected to a connection point where the control power 12 and the source terminal of the PMOS transistor 21 are connected with each other. Further, the input terminal of the inverter circuit 30 is connected to the output terminal of the pulse signal circuit 18 (AND circuit 17), and the output terminal of the inverter circuit 30 is connected to a connection point where the gate terminals of the NMOS transistor 14 and the PMOS transistor 21 are commonly connected. Other circuit configurations are the same as embodiment 1.

According to embodiment 2, the charging path of the capacitor 201 becomes a path A3 shown in FIG. 8. Further, the discharge path of the capacitor 201 becomes a path A4 shown in FIG. 8. That is, the charging path A3 of the capacitor 201 is formed when the NMOS transistor 14 is turned on, and the discharge path A4 of the capacitor 201 is formed when the PMOS transistor 21 is turned on. In comparison to embodiment 1, embodiment 2 is configured so that the charging and discharging roles of the NMOS transistor 14 and the PMOS transistor 21 with respect to the capacitor 201 are replaced. Accordingly, by adding the inverter circuit 30 to the output side of the pulse signal circuit 18, the relationship between the gate signals of the NMOS transistor 14 and the PMOS transistor 21 is replaced to perform the operation as shown in FIG. 7. As a result, embodiment 2 has the same operation and effect as embodiment 1.

Embodiment 3

Figure 9:
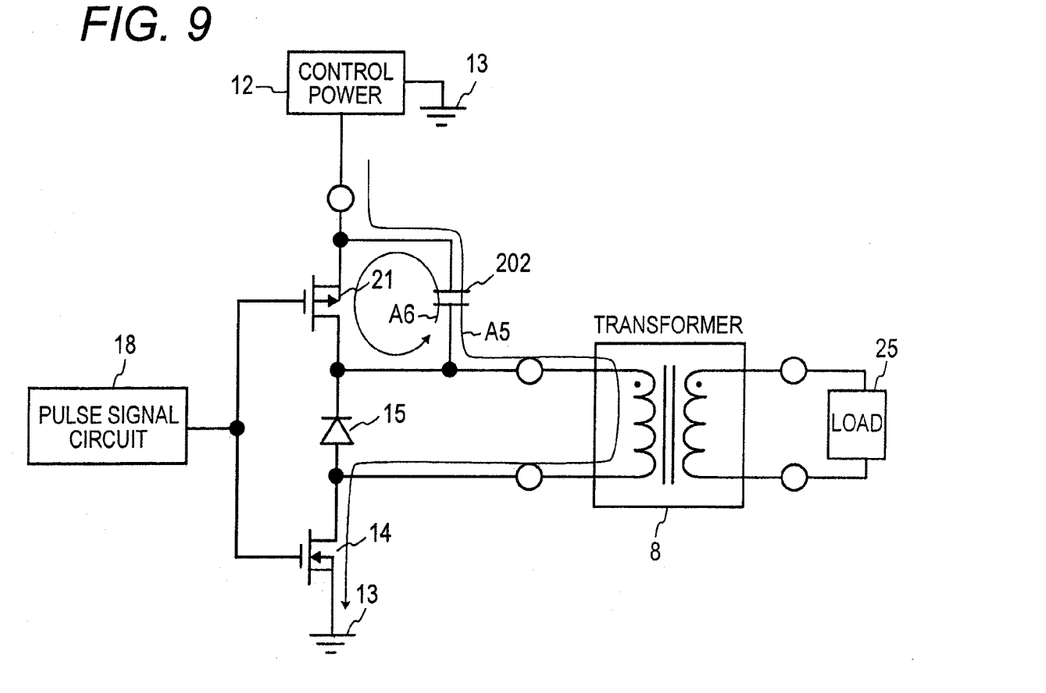
FIG. 9 is a diagram illustrating the circuit configuration of a gate driving circuit according to embodiment 3 of this disclosure.

FIG. 9 illustrates embodiment 3 of this disclosure. Embodiment 3 is different from embodiment 1 in a point that the connection portion of the capacitor 20 is modified (shown as a capacitor 202). That is, one end of the capacitor 202 is connected to a connection point where the drain terminal of the PMOS transistor 21, the one end of the transformer 8 and the cathode terminal of the diode 15 are connected with each other. The other end of the capacitor 201 is connected to a connection point where the control power 12 and the source terminal of the PMOS transistor 21 are connected with each other. Other circuit configurations are the same as embodiment 1.

According to embodiment 3, the charging path of the capacitor 202 becomes a path A5 shown in FIG. 9. Further, the discharge path of the capacitor 202 becomes a path A6 shown in FIG. 9. That is, by turning on the NMOS transistor 14, the charging path A5 of the capacitor 202 is formed to include the primary winding of the transformer 8, and by turning on the PMOS transistor 21, the discharge path A6 of the capacitor 202 is formed.

Figure 10:
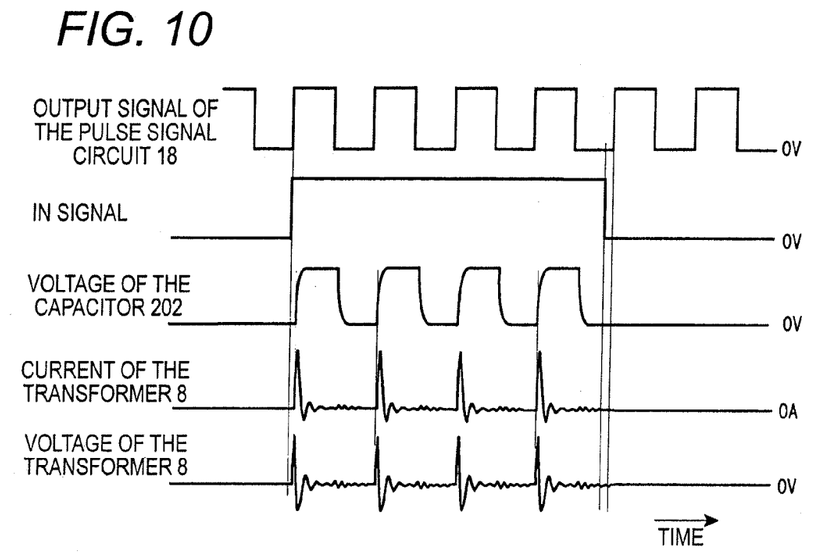
FIG. 10 is a diagram illustrating the circuit operation of a gate driving circuit according to embodiment 3 of this disclosure.

In comparison to embodiment 1, in which the capacitor 20 is discharged when the NMOS transistor 14 is turned on, a voltage is applied to the primary winding of the transformer 8, embodiment 3 is different from embodiment 1 in a point in which the capacitor 202 is charged and a voltage is applied to the primary winding of the transformer 8, when the NMOS transistor 14 is turned on. Accordingly, as compared with the generated voltage waveform of the transformer 8 due to the charging and discharging of the capacitor 20, the generated voltage waveform of the transformer 8 due to the charging and discharging of the capacitor 202 is shown in FIG. 10. The operating waveforms according to embodiment 3 are the same as the operating waveforms of FIG. 7 except for the charging and discharging operation of the capacitor 202. Accordingly, embodiment 3 may be the same as embodiment 1 when considering that the charging and discharging operations of the capacitor 202 have been reversed, and embodiment 3 has the same operation and effect as embodiment 1.

Embodiment 4

Figure 11:
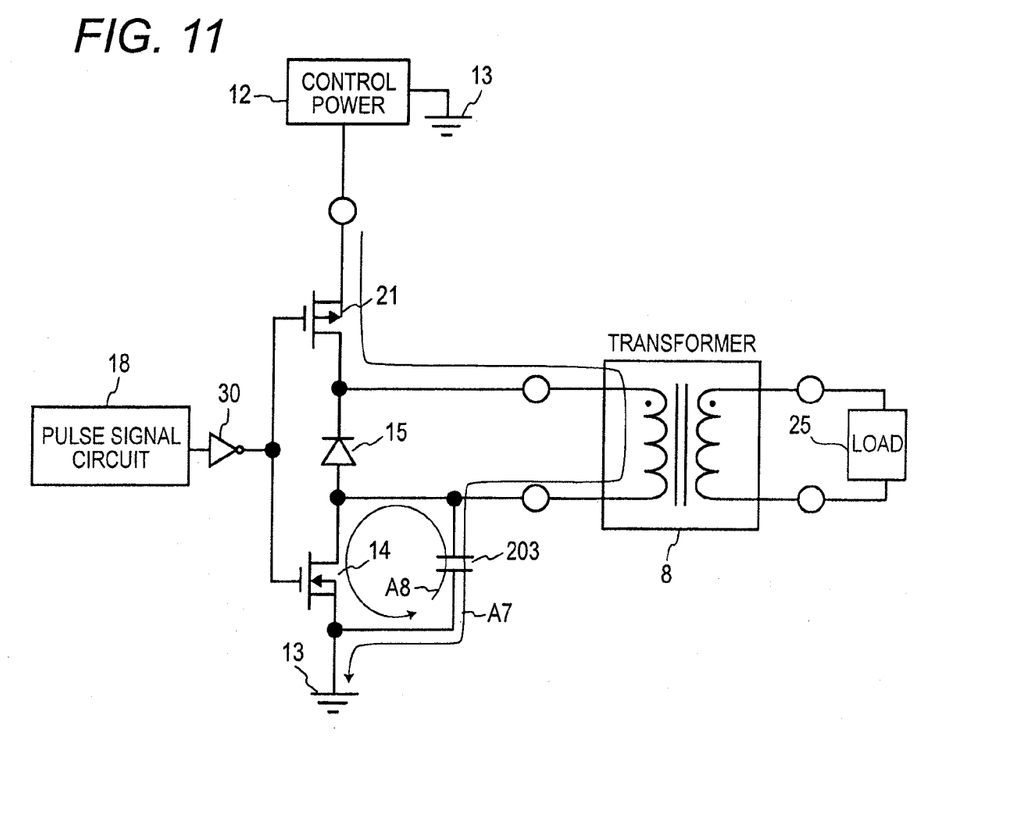
FIG. 11 is a diagram illustrating the circuit configuration of a gate driving circuit according to embodiment 4 of this disclosure.

FIG. 11 illustrates embodiment 4 of this disclosure. Embodiment 4 is different from embodiment 3 in points that the connection portion of the capacitor 202 is modified (shown as a capacitor 203) and an inverter circuit 30 is added to the output side of the pulse signal circuit 18. That is, one end of the capacitor 203 is connected to a connection point where the drain terminal of the NMOS transistor 14, the other end of the transformer 8 and the anode terminal of the diode 15 are connected with each other. The other end of the capacitor 203 is connected to a connection point 13. Further, the input terminal of the inverter circuit 30 is connected to the output terminal of the pulse signal circuit 18 (AND circuit 17), and the output terminal of the inverter circuit 30 is connected to a connection point where the gate terminals of the NMOS transistor 14 and the PMOS transistor 21 are commonly connected. Other circuit configurations are the same as embodiment 3.

According to embodiment 4, the charging path of the capacitor 203 becomes a path A7 shown in FIG. 11. Further, the discharge path of the capacitor 203 becomes a path A8 shown in FIG. 11. That is, by turning on the PMOS transistor 21, the charging path A7 of the capacitor 203 is formed to include the primary winding of the transformer 8, and by turning on the NMOS transistor 14, the discharge path A5 of the capacitor 203 is formed. In comparison to embodiment 3, embodiment 4 is configured so that the charging and discharging roles of the NMOS transistor 14 and the PMOS transistor 21 with respect to the capacitor 203 are replaced. Accordingly, by adding the inverter circuit 30 to the output side of the pulse signal circuit 18, the relationship between the gate signals of the NMOS transistor 14 and the PMOS transistor 21 is replaced to perform the operation as shown in FIG. 7. As a result, embodiment 4 has the same operation and effect as embodiment 3.

In the configuration diagram of this embodiment, no resistor is inserted in the respective charging and discharging paths A1 to A8 of the capacitors 20 and 201 to 203. However, in the case where the NMOS transistor 14 and the PMOS transistor 21 directly charge and discharge the charge of the capacitors 20 and 201 to 203, resistors for suppressing the peak current of the charging and discharging may be inserted. Further, in the case where the NMOS transistor 14 and the PMOS transistor 21 charge and discharge the charge of the capacitors 20 and 201 to 203 through the primary winding of the transformer 8, resistors for suppressing the vibrating current of charging and discharging may be inserted.

Further, the control power 12 and the control power 12' may be common.

Further, although the IGBT is exemplified as the semiconductor switching element, the semiconductor switching element is not limited to the IGBT, and a MOS transistor or a bipolar transistor may be used as the semiconductor switching element. It is also possible to replace the NMOS transistor 14 and the PMOS transistor 21 by bipolar transistors.

Further, the ground to the grounding points 10 and 13 does not necessarily mean the ground to earth, but means the ground to a reference potential.

Since the above described embodiments are examples of this disclosure, this disclosure is not limited to these embodiments, and modifications may be made without departing from the gist of this disclosure.

In the above-described embodiments, the three-phase AC motor has been described as the load. However, this disclosure is not limited thereto, and can be widely applied to a high-frequency heating device as described in Patent Literature 1, an electromagnetic induction heating device, and other loads.

What is claimed is:

1. A gate driving circuit comprising:
a control power; a transformer having a primary winding and a secondary winding; a first switching element; a second switching element; a rectifying element; and a capacitance element,
wherein the first switching element is connected between the control power and one end of the primary winding, and the second switching element is connected to the other end of the primary winding,
wherein both ends of the rectifying element are connected in parallel to both ends of the primary winding,
wherein one end of the capacitance element is connected to either one of the one end and the other end of the primary winding, and
wherein, when one of the first switching element and the second switching element is turned on, the capacitance element is charged by the control power, and when the other of the first switching element and the second switching element is turned on, the capacitance element is discharged.

2. The gate driving circuit according to claim 1, further comprising
a reception circuit, which detects a wiring voltage generated in the secondary winding in accordance with rising and falling of current flowing into the primary winding,
wherein the reception circuit outputs a control pulse signal according to the wiring voltage.

3. The gate driving circuit according to claim 1, wherein one end of the capacitance element is connected to one end of the primary winding.

4. The gate driving circuit according to claim 1, wherein one end of the capacitance element is connected to the other end of the primary winding.

5. The gate driving circuit according to claim 1, wherein the other end of the capacitance element is grounded.

6. The gate driving circuit according to claim 1, wherein the other end of the capacitance element is connected to the control power.

7. The gate driving circuit according to claim 1, wherein the capacitance element is configured to be charged with passing the primary winding when the capacitance element is charged by the control power and to be discharged without passing the primary winding when the capacitance element is discharged.

8. The gate driving circuit according to claim 1, wherein the capacitance element is configured to be charged without passing the primary winding when the capacitance element is charged by the control power and to be discharged with passing the primary winding when the capacitance element is discharged.

9. The gate driving circuit according to claim 1, wherein the capacitance element is configured to be discharged with passing the primary winding when the capacitance element is discharged.

10. The gate driving circuit according to claim 1, wherein the capacitance element is configured to be charged with passing the primary winding when the capacitance element is charged by the control power.

* * * * *